(12) United States Patent
Dance et al.

(10) Patent No.: US 7,245,980 B1
(45) Date of Patent: Jul. 17, 2007

(54) METHOD AND APPARATUS FOR CALCULATION OF PRODUCTION QUANTITIES

(75) Inventors: Daren Dance, Austin, TX (US); David Jimenez, San Ramon, CA (US)

(73) Assignee: Wright Williams & Kelly, Inc., Pleasanton, CA (US)

( * ) Notice: Subject to any disclaimer, the term of this patent is extended or adjusted under 35 U.S.C. 154(b) by 716 days.

(21) Appl. No.: 09/888,856

(22) Filed: Jun. 25, 2001

Related U.S. Application Data

(60) Provisional application No. 60/215,910, filed on Jul. 3, 2000.

(51) Int. Cl.
 *G06F 19/00* (2006.01)
 *G06F 17/50* (2006.01)
 *G11B 15/10* (2006.01)
 *G11B 5/52* (2006.01)

(52) U.S. Cl. .................. 700/121; 703/13; 700/116; 360/137; 360/271

(58) Field of Classification Search .............. 703/13, 703/22; 700/97, 116
See application file for complete search history.

(56) References Cited

U.S. PATENT DOCUMENTS

| | | | |
|---|---|---|---|
| 5,719,796 A * | 2/1998 | Chen | 703/13 |
| 5,790,406 A * | 8/1998 | Dunn et al. | 700/169 |
| 5,946,212 A * | 8/1999 | Bermon et al. | 700/97 |
| 6,308,107 B1 * | 10/2001 | Conboy et al. | 700/121 |
| 6,341,240 B1 * | 1/2002 | Bermon et al. | 700/97 |
| 6,430,456 B1 * | 8/2002 | Black et al. | 700/110 |
| 6,442,445 B1 * | 8/2002 | Bunkofske et al. | 700/108 |
| 6,456,894 B1 * | 9/2002 | Nulman | 700/121 |
| 6,615,098 B1 * | 9/2003 | Bode et al. | 700/121 |

OTHER PUBLICATIONS

Dance et al., "Modeling the Cost of Ownership of Assembly and Inspection" IEEE 1996 p. 57-60.*

(Continued)

*Primary Examiner*—Anthony Knight
*Assistant Examiner*—Tom Stevens
(74) *Attorney, Agent, or Firm*—Innovation Partners; Charles E. Gotlieb

(57) ABSTRACT

A method and apparatus calculates production quantities of a production system such as the throughput of a tool group, good unit equivalents of a tool group, number of units shipped and started for each step of the production system, process time of each step, average processing time, rate and units processed for each tool group, number of tools required and minimum and actual number of test cells or tool groups required. Some or all of these production quantities are calculated by taking into account the downtime of any controller of a tool group.

29 Claims, 3 Drawing Sheets

OTHER PUBLICATIONS

Dance et al., "Modeling the Cost of Ownership of Assembly and Inspection" IEEE 1995 p. 51-54.*

Dance et al., "Modeling Test Cost of Ownership" IEEE p. 16-17 p. 16-17.*

Grewal et al., Integrating Targeted Cycle-Time Redjuction into the Capital Planning Process. 1998 Winter Simulation Process. p. 1005-1010.*

Jackson et al., "Real Time Discrete Event Simulation of a PCB Production System for Operational Support" 1997 Winter Simulation Conference p. 832-837.*

Grewal et al., "Integrating Targeted Cycle-Time Reduction into the Capital Planning Process" 1998 Winter Simulation Conference p. 1005-1010.*

Cambell et al., "A Model of a 300mm Wafer Fabrication Line" 1999 Winter Simulation Conference p. 909-911.*

Hallas et al., "An Investigation of Operating Methods for 0.25 Micron Semiconductor Manufacturing" 1996 Winter Simulation Conference. p. 1023-1030.*

Robinson et al., "Capacity Planning for Semiconductor Wafer Fabrication with Time Constraints Between Operations" 1999 Winter Simulation Conference p. 880-887.*

Domaschke et al., "Effective Implementation of Cycle Time Reduction Strategies for Semiconductor Back-End Manufacturing" Winter Simulation Conference 1998 p. 985-982.*

* cited by examiner

METHOD AND APPARATUS FOR CALCULATION OF PRODUCTION QUANTITIES

RELATED APPLICATIONS

This application claims the benefit of U.S. Provisional Application No. 60/215,910 entitled, "METHOD AND APPARATUS FOR CALCULATION OF PRODUCTION QUANTITIES" filed Jul. 3, 2000 by Daren Dance and David Jimenez and is hereby incorporated herein by reference in its entirety.

FIELD OF THE INVENTION

The present invention is related to computer software and more specifically to computer software for simulation of production processes.

BACKGROUND OF THE INVENTION

Production processing tools process a component to facilitate the production of a product. A production processing tool may transport the component, perform work on the component, or test the component, among other possible tasks performed by the tool.

In a production process, one or more tools may be thought of as a group. Tools in a group may all perform the same process step, or may perform different process steps. Tools in a group may be operated by one or more operators. In many circumstances, however, the tools in a group facilitate one or more related steps in a production process.

When two or more tools in a group are operated by a single operator, or controlled by a single controller, the efficiency of each individual tool may be decreased. For example, if an operator idles all tools in a group to load them, then operates them all simultaneously, tools will be idled while other tools are loaded. This reduces the efficiency of each tool in the group, but may increase the efficiency of utilization of the operator by spreading the cost of the operator across multiple tools.

To estimate production quantities of a production system, the throughput and yield of each tool used individually may be measured, and the measurements adjusted to take into account the loss of efficiency due to the configuration of each tool in the group. Based on parameters of the production process, the production process may be simulated and certain production quantities may be calculated, such as the number of units of a material to start in the production process to achieve a certain number of units required at the output.

However, many modern production process tools are controlled by tools in other groups. The production quantities of one group can therefore be interrelated with the production quantities of the controlling tool group. If the controlling tool group is not operational, the tool group controlled by the non-operational tool group will be out of operation as well, affecting the production quantities. Conventional simulation tools do not account for this fact, making the production quantities calculated by these simulators erroneous.

What is needed is a method and apparatus for more accurate calculation of production quantities.

SUMMARY OF INVENTION

A method and apparatus accepts parameters of one or more groups of one or more tools in a production system, including a parameter related to the downtime of any controlling system, such as the percentage of time the controlling system is down. The method and apparatus also accepts parameters related to the configuration of each tool group in the production system. The method and apparatus calculates production quantities, some of which take into account the downtime of any controller of a tool group.

Because the downtime of the controller is used to calculate the production quantities, the production quantities more accurately reflect the operation of the production system.

DETAILED DESCRIPTION OF A PREFERRED EMBODIMENT

Figure 1:
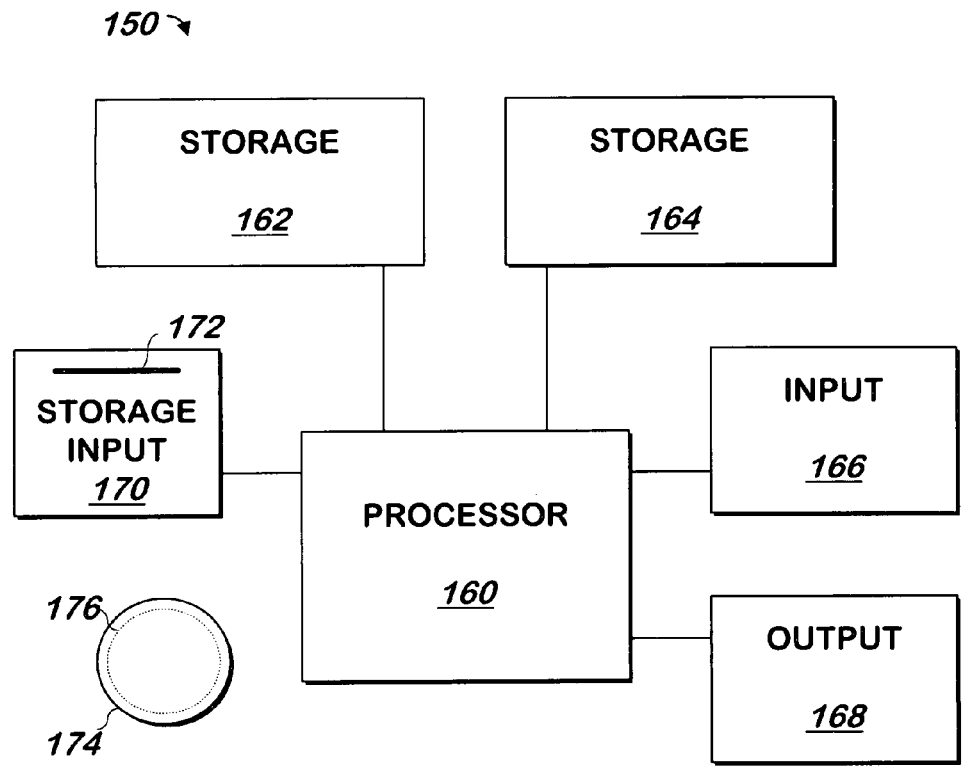
FIG. 1 is a block schematic diagram of a conventional computer system.

The present invention may be implemented as computer software on a conventional computer system. Referring now to FIG. 1, a conventional computer system 150 for practicing the present invention is shown. Processor 160 retrieves and executes software instructions stored in storage 162 such as memory, which may be Random Access Memory (RAM) and may control other components to perform the present invention. Storage 162 may be used to store program instructions or data or both. Storage 164, such as a computer disk drive or other nonvolatile storage, may provide storage of data or program instructions. In one embodiment, storage 164 provides longer term storage of instructions and data, with storage 162 providing storage for data or instructions that may only be required for a shorter time than that of storage 164. Input device 166 such as a computer keyboard or mouse or both allows user input to the computer system 150. Output 168, such as a display or printer, allows the computer system to provide information such as instructions, data or other information to the user of the computer system 150. Storage input device 170 such as a conventional floppy disk drive or CD-ROM drive accepts via input 172 computer program products 174 such as a conventional floppy disk or CD-ROM or other nonvolatile storage media that may be used to transport computer instructions or data to the computer system 150. Computer program product 174 has encoded thereon computer readable program code devices 176, such as magnetic charges in the case of a floppy disk or optical encodings in the case of a CD-ROM which are encoded as program instructions, data or both to configure the computer system 150 to operate as described below.

In one embodiment, each computer system 150 is a conventional Pentium-compatible computer system such as the 6540C commercially available from Hewlett-Packard corporation of Palo Alto, Calif. running the conventional Windows 98 operating system commercially available from Microsoft Corporation of Redmond, Wash., although other systems may be used.

Figure 2:
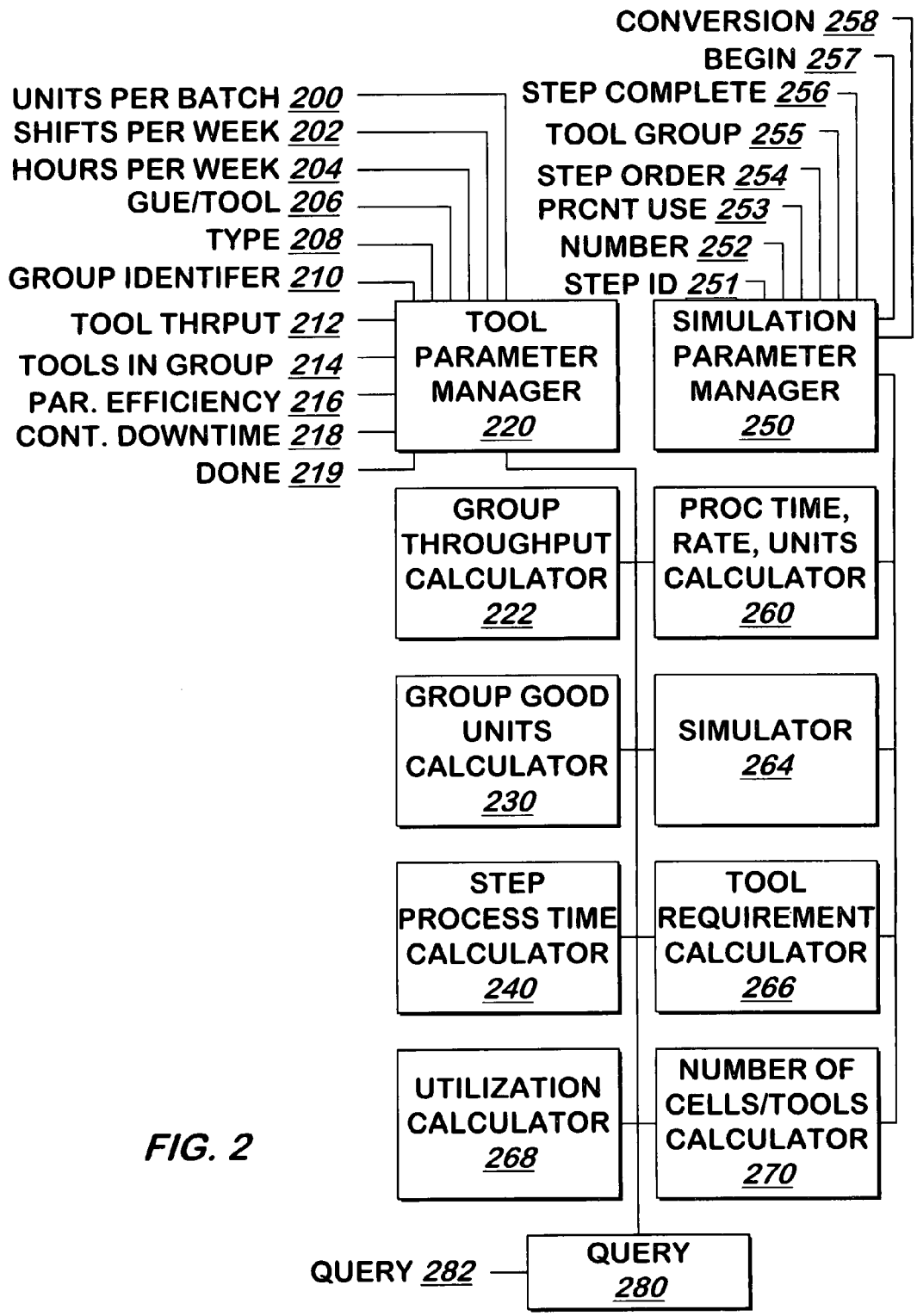
FIG. 2 is a block schematic diagram of an apparatus for calculating production quantities of a production system made up of one or more tool groups according to one embodiment of the present invention.

Referring now to FIG. 2, an apparatus for calculating production quantities of a production system made up of one or more tool groups is shown according to one embodiment of the present invention. As used herein, a production system is any system that assists in the production of one or more products. A production system need not produce anything by itself: a production system may simply test the output produced by another production system. The production system may be made up of one or more tool groups, logically related to one another in some way. Each tool group may be made up of one or more tools. Each tool may simultaneously process one or more units of the production process.

In one embodiment, a user of the apparatus of FIG. 2 defines various tool groups to tool parameter manager 220 by inputting to the apparatus various parameters of the tool group. After each tool group is defined, tool parameter manager 220 performs certain calculations using the parameters to begin calculating production quantities for the tool group. The user then instructs the apparatus how each tool group operates in the production system by defining to simulation parameter manager 250 simulation parameters for each step in the production process, including which tool group defined above is used by the step. Using the parameters defined and optionally the calculations performed, production quantities for each tool group and for the production system are calculated by the apparatus and method and some or all of them may be displayed or otherwise provided to a user as described in more detail below.

To define each tool group to the apparatus of FIG. 2, the user uses tool parameter manager 220. In one embodiment, tool parameter manager 220 prompts the user for the parameters to provide at inputs 200-219 via an output not shown coupled to a conventional monitor or printer or other output device (not shown), and in another embodiment, no such prompts are provided. Inputs 200-219 may be coupled to a conventional input device such as a keyboard and mouse or a storage device such as a disk or tape drive or memory. In one embodiment, inputs 200-219, along with inputs 251-257 described below, are a single input, but have been labeled as separate inputs for ease of reference.

Tool parameter manager 220 prompts for, and receives at inputs 200-218 parameters for each tool group. For each tool group, tool parameter manager 220 builds a tool group record for that tool group and internally stores the parameters it receives at inputs 200-218 in that record. Production quantities for the tool group are calculated by other portions of the apparatus as described in more detail below, and these quantities are also stored in the record for the tool group by tool parameter manager 220. The various parameter inputs 200-219 will now be described.

Group identifier input 210 receives a unique identifier for the tool group. The identifier may be any alphanumeric identifier that may be used to identify a tool group. If the user enters an identifier of a tool group that is already in use, tool parameter manager 220 allows the user to revise the parameters already entered for that group after providing a warning that the tool group identifier is already in use.

Tool throughput input 212 receives the maximum number of batches the average tool in the group is capable of processing in a given unit of time, such as a week, assuming the tool is operated as the only tool in the group, and assuming any controller for that tool is always operational. A batch corresponds to an operation of the tool, whether fully loaded or not. Units per batch input 200 receives the number of units the average tool in the group is capable of processing at the same time in a single batch.

Shifts input 202 receives the number of shifts during the period corresponding to the period used for tool throughput input 212. Hours input 204 receives the number of hours in a shift over the period of time corresponding to the period used for tool throughput input 212. For example, if the period of time used for tool throughput input 212 is a week, this same period of time is used for input 202 and 204.

Tools in group input 214 receives the actual number of tools in the group that can operate simultaneously, and the maximum number of tools that could be in a group and operating simultaneously. For example, a group may be capable of having five tools due to controller limitations, but only operate 3 tools due to space limitations. Both of these numbers are entered into tools in group input 214.

GUE/tool input 206 receives the average good unit equivalent ratio for each tool in the group. The good unit equivalent ratio is the ratio of the number of good units that come out of a tool divided by the number of units that are input to the tool to get that number out. For example, if twenty percent of units fail under a test, the GUE for the tool is 0.8.

Parallel efficiency input 216 receives the parallel unit efficiency of the tools in the group. The parallel unit efficiency is calculated by dividing the theoretical amount of time required to process one load if the tool had a dedicated operator and controller, by the amount of time required to process one load as actually operated. The downtime of any controller is ignored for the purpose of this input.

The amount of time a tool takes to process one load in practice may be longer that the amount of time the tool takes to process one load in theory because an operator operating, or controller controlling, multiple tools may be busy working on another tool in the group when a particular tool requires service, making the load take longer to process than it would if the tool had a dedicated controller or operator.

For example, assume that two tools are each loaded in one minute, unloaded in one minute and operated simultaneously for four minutes when both are loaded. The parallel efficiency for each tool in the group would be 0.75: the tool is capable of processing one load in six minutes if operated by itself, but each load takes eight minutes due to the actual availability of the operator. Six divided by eight is 0.75.

Type input 208 receives information about the type of the group. The user may specify whether the tool group may be selected as a controller of another group, whether the tool group is itself controlled by another group, and whether the tools in the group are operated in parallel, where multiple tools operate at the same time, or whether the tools in the group operate in an alternating fashion, where only one tool is operational at a given time, and all other tools in the group are not operational while the operational tool is operating.

Tool parameter manager 220 stores in the tool group record the values it receives at input 208 and also stores in the tool group record a type code depending on the information received at input 208. If the tool group is capable of being selected as a controller, if the tool group is not also capable of being controlled by another group, tool parameter manager 220 stores a type value of 1, and if the tool group is capable of being controlled by another tool group, tool parameter manager 220 stores a type value of 4. If the tool group is operated in parallel, if the tool group is capable of being controlled by another tool group, tool parameter manager stores a type value of 2, and if the tool group is not capable of being controlled by another tool group, tool parameter manager stores a type value of 3 for the tool group. If the tool group is operated in the alternating parallel configuration, if the tool group is capable of being controlled by another tool group, tool parameter manager stores a type value of 2, and if the tool group is not capable of being controlled by another tool group, tool parameter manager stores a type value of 3 for the tool group.

Controller downtime input 218 receives the percentage of time that any controller of the tool group is not operational during the time the tools in the group are in use. If no controller operates the group, the controller downtime is zero, which may be entered by the operator, or tool parameter manager 220 may fill in this amount using the information input at input 208 indicating that no controller controls the tool group.

When the user has completed providing the parameters described above for a given tool group, the user indicates that he or she has completed providing parameters for the tool group by signaling at the done input 219. Tool parameter manager 220 then prompts the user to enter parameters for another group or change parameters already entered for an existing group as described above. Tool parameter manager 220 also signals, by providing the group identifier received at input 210 for the group the user completed when he or she provided the done signal at done input 219, to group throughput calculator 222 and group good units calculator 230.

Group throughput calculator 222 copies some or all of the tool group record for the tool group identifier received from tool parameter manager 220, calculates the throughput of a tool group and stores the result back into the tool group record in tool parameter manager 220. The throughput of a tool group is equal to the product of the number of units each tool can handle per batch of input 200, the batch throughput of input 212, the number of tools in the group received at input 214, the parallel unit efficiency received at input 216 and the controller downtime received at input 218 subtracted from one. This may be mathematically represented as $$\text{Group Throughput} = (200 * 212 * 214 * 216 * (1 - 218)) \quad \text{(eq. 1a).}$$

(In all equations, statement or expressions, a 2XX number means the input received at that input for the tool group.)

If the type of the tool group is 2 or 3, input 218 will be zero, and so the 1-218 term need not be used in equation 1a.

In another embodiment, the inputs 216 and 218 are ignored for the throughput calculation, and the throughput is $$\text{Group throughput} = (200 * 212 * 214 *) \quad \text{(eq. 1b).}$$

Group throughput calculator 222 calculates the throughput as described above and inserts into the record in tool parameter manager 220 the throughput for the tool group it calculates.

Group good units calculator 230 receives from tool parameter manager 220 the identifier of the tool group, copies from tool parameter manager 220 some or all of the tool group record for that group and calculates the good unit equivalents produced per unit of time as:

$$(206 * 212 * 214 * 216 * (1 - 218)) \quad \text{(eq. 2).}$$

If the tool group is identified as not controlled by another group (types 1 and 3), the (1-218) term may be ignored because input 218 should be zero.

The good units equivalents calculated by group good units calculator 230 is the number of good units the tool group is capable of producing during a given unit of time corresponding to the unit of time used in the throughput parameter received at input 212. Group good units calculator 230 inserts the result into a field in the tool group record stored in tool parameter manager 220.

If desired, good units calculator 230 may utilize the group throughput figure for the tool group stored there by group throughput calculator 222 in its calculations.

Simulation parameter manager 250 prompts for, and receives at inputs 251-257 parameters for each step in the production process. For each step, simulation parameter manager 250 builds a step record for that step and internally stores the parameters it receives at inputs 251-257 in that record. Production quantities for the tool groups used in the steps defined and production quantities for the steps are calculated by other portions of the apparatus as described in more detail below, and these quantities are also stored in the record for the tool group by simulation parameter manager 250. The various parameter inputs 251-257 will now be described.

In one embodiment, each step in the production process is given an identifier at input 251. For each such step so identified, inputs 253-255 may be used to define parameters for that step. If a user inputs at input 251 an identifier already in use, simulation parameter manager 250 allows the user to change parameters stored for that step after warning the user that the step identifier is in use.

Percent of use input 253 receives the percent of use for the step. The percent of use is the percent of the total number of units processed that are processed through the tool group used for that step. Some steps only process through the tool group a fraction of the number of units in the step because the step performs tests that are largely expected to pass if one or more prior steps have been performed properly. Thus, ten percent of a system batch may be tested at a certain step, and if the ten percent all pass the test or nearly all pass the test, the system batch is assumed good enough to move to the next step without testing the remaining 90% of the batch.

Step order input 254 receives an indication of the order in all of the steps in which the step having the identifier received at input 251 is performed. The first step may be step 1 (or step 0) and the next step has a step number one higher than that step. Tool group input 255 receives the identifier of the tool group that is used to perform the step, the identifier corresponding to the identifier received at input 210 of tool parameter manager 220 described above.

When the user has completed providing the information for inputs 251, 253, 254 and 255, the user signals at step complete input 256. Simulation parameter manager 250 builds a step record for each step and inserts the information received from inputs 251, 253, 254 and 255 into the step record.

Number input 252 is used only for a single one of the steps in the production process. Number input 252 receives a number of units, an indication of whether the number is the number of units started in that step or the number of units shipped out of that step, and the step number in the process for which the number of units is either started or shipped. This allows a user to define a quantity at a single point in the production process to be used for calculations. The quantities for all other points in the production process are calculated according to the parameters received for each tool group and for each step as described below. Simulation parameter manager 250 internally stores the number received at number input 252 either in the record for the step or separately.

When the user has completed defining all of the steps for some or all of the production system in which the user is interested, the user signals at the begin input 257. Simulation parameter manager 250 signals simulator 264 and step process time calculator 240.

Simulator 264 receives from simulation parameter manager 250 some or all of the step records for each step in the process, and calculates the number of units that will be used to start the step and the number of units shipped out of that step, which is the number of units that will be used to start the next step in the production process. The number received at number input 252 is retrieved from simulation parameter manager 250. If the number provided at number input 252 is the number of units to start the first step, for each step in the process, simulator 264 copies the tool group record from tool parameter manager 220 corresponding to the tool group in the step record and identifies the number of units that will be "shipped" out of that step by: i) multiplying the calculated group good unit equivalents from the tool group record corresponding to the tool group defined for that step by the percent of use in the tool group record corresponding to the tool group defined for that step, ii) adding the result to the percent of use subtracted from one, and iii) multiplying the sum by the number of units started by the step. Using the input numbers of the Figure, the number shipped for any step is calculated as:

$$\text{Number of units shipped} = \text{Number of Units Started} * ((206*253)+(1-253)) \quad \text{(Eq. 3)}.$$

Where 206 corresponds to the calculated good unit equivalent for the tool group corresponding to the tool group defined for the step, 253 corresponds to the percent of use defined for the step, the number of units started is equal to input 252 if the step for which the number of units started is being calculated is the first step and is equal to the number of units shipped from the prior step for all steps after the first step.

Simulator 264 performs this calculation for each step in the production process in step order and stores the number of units started and the number of units shipped for each step in simulation parameter manager 250 in the record for the step. As described above, the number of units started for a step is equal to the number of units shipped for the prior step in the production process.

In one embodiment, a user may enter at input 256 the number of units to be shipped out of the final step, in place of the number of units to be started in the first step at input 252. In such embodiment, simulator 264 calculates the number started by each step, beginning with the last step and working one step at a time backwards until the first step is reached. In such embodiment, the number started by a step is equal to the number shipped by that step divided by the sum of a) the product of the good unit equivalent for the tools used in that step and the percent of use, and b) the percent of use subtracted from one. Using the inputs of FIG. 2:

$$\text{Number of Units Started} = \text{Number of Units Shipped}/((206*253)+(1-253)) \quad \text{(Eq. 4)}.$$

Simulator 264 uses the number of input 252 as the number of units shipped for the last step and the number of units shipped for a step as the number of units started for the next step, and repeats the calculations, in reverse step order, for each step in the production process until it has computed the number shipped for all of the steps in the production process, storing the results in simulation parameter manager 250 in the step record as described above.

If the user enters at input 252 a number of units that is not the number started at the first step or the number shipped at the last step, simulator 264 uses both of the above techniques to calculate forward and backwards from the step corresponding to the number entered at input 252.

When simulator 264 has completed the calculations for all of the steps as described above, simulator 264 then signals process time, rate and units calculator 260 for operation as described below.

Step process time calculator 240 calculates the amount of time in hours it takes to process a unit during each step. For each step defined in simulation parameter manager 250, step process time calculator 240 calculates the processing time for a single unit at a given step for by copying from tool parameter manager 220 some or all of the tool group record for the tool group defined in the step record, dividing the product of inputs 204 and 202 for the tool group by the output of good units calculator 230 for that tool group. Step process time calculator 240 retrieves from simulation parameter manager 250 the tool group identifier for each step in the production process, calculates the process time for that tool group, and stores the result as the process time per unit in simulation parameter manager 250 in the step record for the step.

Process time, rate and units calculator 260 calculates the average process time each tool group takes to process a single unit during the entire production process. In some production processes, a tool group may be used during multiple steps, so this result can be different from the result provided by step process time calculator 240.

Process time, rate and units calculator 260 copies from tool parameter manager 220 some or all of a first tool group record. Process time, rate and units calculator 260 maintains three variables, a numerator, a denominator, and a number of units which are each initialized to zero about the time the tool group record is retrieved. Using the tool group record retrieved, process time, rate and units calculator 260 retrieves the tool group identifier for each step in simulation parameter manager 250 and if the tool group for the step retrieved from simulation parameter manager 250 matches the tool group retrieved from tool parameter manager 220, process time, rate and units calculator 260 retrieves the number of units started and percent of use for that step from tool simulation parameter manager 250. Process time, rate and units calculator 260 adds to the numerator the product of the number of units started at that step and the process time for the tool group. Process time, rate and units calculator 260 also adds to the denominator the number of units started at that step. Process time, rate and units calculator 260 also adds to the number of units the product of the number of units started at that step and the percent of use for the step. If the tool group identifier for the step in simulation parameter manager 250 does not match the tool group identifier retrieved from tool group parameter storage 220, no additions to the numerator or denominator are made and the tool group identifier of the next step is retrieved from simulation parameter manager 250.

When all of the steps have processed as described above for a tool group, if the denominator is zero, process time, rate and units calculator 260 stores a zero as the average process time for the tool group and a zero for the processing rate for the tool group in tool group parameter storage 220 in the tool group record in tool parameter manager 220. Otherwise, process time, rate and units calculator 260 calculates the average process time by dividing the numerator by the denominator, stores the result as the average process time for the tool group in tool parameter manager 220 in the tool group record for the tool group selected. Additionally, process time, rate and units calculator 260 calculates the processing rate for the tool group by dividing the denominator by the numerator, stores the result as the rate for the tool group in tool group record in tool parameter manager 220. Process time, rate and units calculator 260 stores the number of units in tool group parameter storage 220 in the tool group record. Process time, rate and units calculator 260 zeros the three variables and selects the next tool group record from tool group parameter storage 220 and repeats the steps above until records for all of the tool groups have been processed in this manner. Process time, rate and units calculator 260 then signals tool requirements calculator 266.

Tool requirements calculator 266 calculates the number of tools required to meet the capacity defined to simulation parameter manager 250 using the number of starts or number of ships parameters described above. Tool requirements calculator 264 selects a first tool group copies some or all of the record for the selected tool group in tool group parameter storage 220, and calculates the number of tools required by dividing the product of the number of units for the tool group calculated as described above and the number of tools in the group, by the product of the rate for the tool group, the hours for the tool group, the number of shifts for that tool group and the number of units per batch. Tool requirements calculator 266 then rounds the number to the nearest whole number equal to or greater than the number and stores the result in the tool group record in tool parameter storage 220 for the selected tool group in one embodiment.

Tool requirements calculator 266 then selects another tool group and repeats the process described above until all of the tool groups have been processed as described above. When all tool groups have been selected and processed by tool requirements calculator 266, tool requirements calculator 266 signals utilization calculator 268 and number of cells/tools calculator 270.

Utilization calculator 268 calculates the percent utilization of the average tool in each tool group. Utilization calculator 268 selects a first tool group and copies some or all of the tool group record for the tool group. Utilization calculator 268 calculates the percent utilization of the tool group by dividing the number of units calculated for that tool group by the product of the throughput for the average tool in the tool group received at input 212, the number of tools in the group received at input 214, the hours for the tool group received at input 204, the number of shifts for the tool group received at input 202 and the number of units per batch received at input 200 for the tool group. Utilization calculator 268 stores the result as the average utilization for the tool group in the record for the tool group, selects another tool group in tool parameter storage and repeats the process until all tool groups have been selected and processed as described above.

Number of cells/tools calculator 270 calculates the minimum number of tool groups required by selecting a first tool group, dividing the number of tools required in the record for the selected tool group by the maximum number of tools allowed in the group, originally received via input 214, and storing the result as the minimum number of tool groups in the tool group record in tool parameter manager 220.

In one embodiment, the number of units per batch received at input 200 is the number of units a tool group can process in the batch, and the number of tools in the group received at input 214 is instead the number of tool groups in a cell, that may be made up of multiple tool groups. In this embodiment, the number of tool groups calculated by number of cells/tools calculator 270 is instead the number of cells.

In one embodiment, number of cells/tool calculator 270 also calculates the number of tool groups (or test cells in the other embodiment) required if each tool group (or test cell) has the same number of tools as the number of tools in the group (or number of groups in the cell), received at input 214 by dividing the number of tools required by the actual number of tools in each tool group (or number of groups in each cell), rounding up and storing the result in the record for the tool group in tool parameter manager 220.

In one embodiment, number of cells/tools calculator 270 also multiplies the number of tool groups (or test cells) required if each tool group (or test cell) has the same number of tools (or tool groups) as the actual number of tools in the group (or number of tool groups in the test cell) by the number of tools in each group (or number of groups in each test cell) to provide a number of tools required if all groups have the same number of tools, and stores the result in the tool group record in tool parameter manager 220.

Number of cells/tools calculator 270 then selects another tool group and repeats the process of all calculations described above until all tool groups have been selected and processed as described above.

A user may view any of the parameters or values calculated and stored in the tool group record as described above using tool parameter manager 220 or in simulation parameter storage 250 using query input/output 282 of query processor 280, coupled to a conventional keyboard/monitor/mouse combination. Any of these parameters or values are referred to as "production quantities". Production quantities not received as parameters are referred to as calculated production quantities. Production quantities may be queried for some or all tool groups or steps, or reports may be generated.

In one embodiment, some steps may use different definitions of a unit. For example, if one step defines a unit as a semiconductor wafer and another step defines a unit as one of the many dies on the wafer, the conversion number to convert from one form of units to another form of units may be identified as part of the step at conversion input 258. For example, if step 4 uses N dies to a wafer, the conversion factor provided at step 4 will be "N". Steps subsequent to that step are assumed to use that same conversion factor. The number of starts and ships is maintained by simulator parameter storage 250 and simulator 264 in the same unit measurement as the number received at number input 252, but this number may be converted by query processor 280 to be consistent with any factor input.

Figure 3:
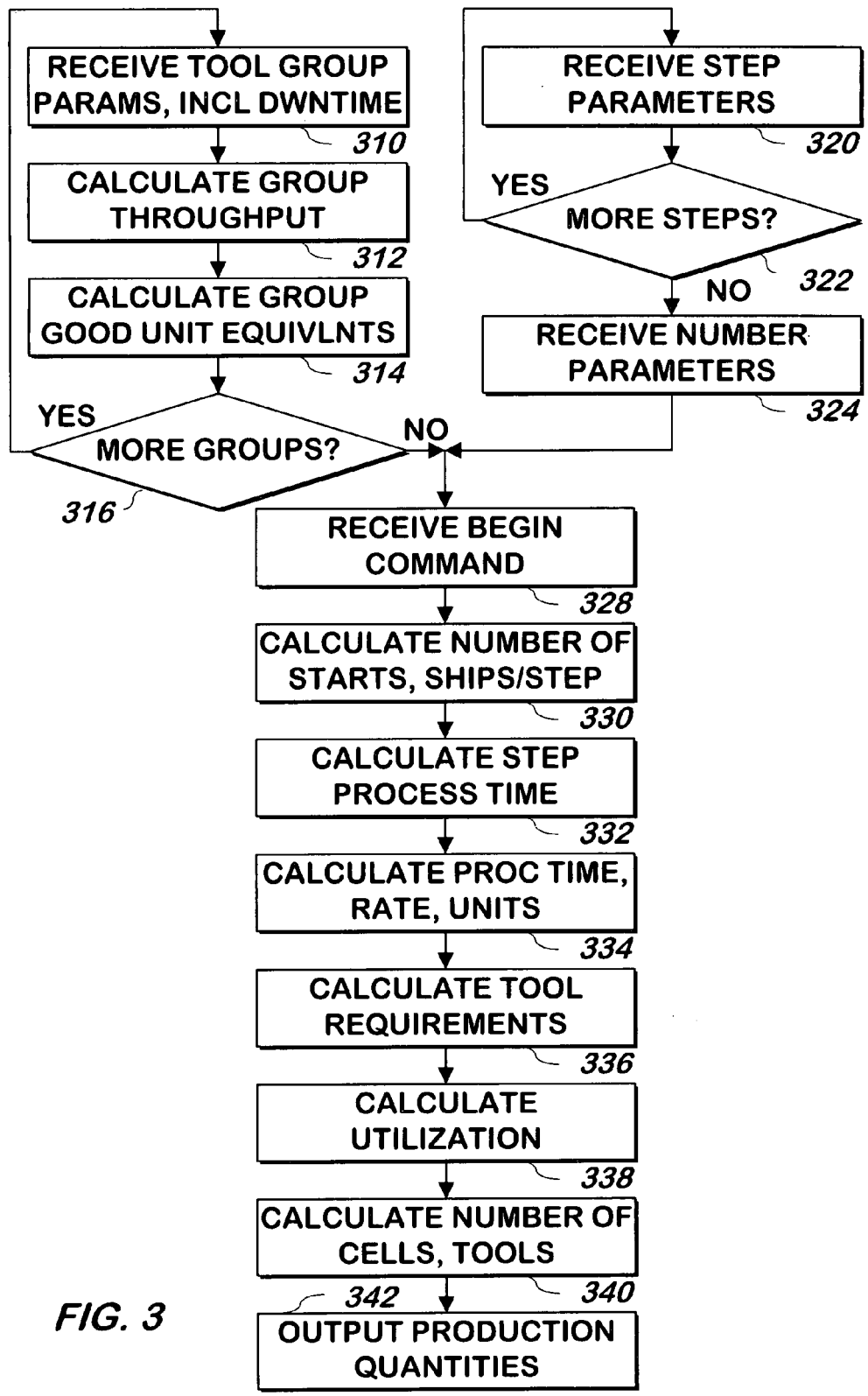
FIG. 3 is a flowchart illustrating a method of calculating production quantities of a production system made up of one or more tool groups according to one embodiment of the present invention.

Referring now to FIG. 3, a method of calculating production quantities is shown according to one embodiment of the present invention. Tool group parameters are received 310 for a tool group as described above. The tool group parameters include a measure of downtime of any controller as described above. The throughput and group good unit equivalents are calculated 312, 314 for the group as described above and if there are more tool groups 316, the method continues at step 310 for the next tool group, otherwise, the method continues at step 328.

Step parameters for a step in the production process are also received 320 as described above. If there are additional steps in the production process 322, the method continues at step 320 to receive the parameters for any additional step. Otherwise 322, the method continues at step 324.

The number parameters are received as described above, describing the number, whether the number corresponds to a number of starts or ships, and the step in the production process corresponding to the number are received 324 as described above and the method continues at step 328.

A begin command or other similar indication may be optionally received 328. The number of ships and starts is calculated for each step 330 as described above. The process time for each step is calculated 332 as described above. The process time, rate and number of units for each tool group are calculated 334 as described above. The tool requirements are calculated for each tool group 336 as described above. The utilization of each tool group is calculated 338 for each tool group as described above. The number of tool groups or cells and the number of tools are calculated 340 as described above. One some or all of the production quantities are output 342 in response to a query or as part of a report as described above.

What is claimed is:

1. A method of predicting at least one production quantity of a production system comprising a first set of at least one tool controlled by a second set of at least one tool, the method comprising:
   receiving a quantity of time during which the second set of at least one tool is not able to control the first set of at least one tool; and
   calculating the at least one production quantity affected by the first set of at least one tool responsive to the quantity of time received.

2. The method of claim 1 wherein the quantity of time received is a quantity of time at least one of the at least one tool in the second set is not operational.

3. The method of claim 1 wherein at least one of the at least one tool in the first set comprises a production processing tool.

4. The method of claim 1 wherein the quantity of time comprises a percentage.

5. The method of claim 1 wherein the production quantity comprises a throughput.

6. The method of claim 1 wherein the production quantity comprises a good unit equivalents produced per unit of time.

7. The method of claim 1 wherein:
   the production process comprises a plurality of sets of at least one tool, comprising the first set and the second set and a third set; and
   the production quantity is additionally calculated responsive to a quantity related to the third set of at least one tool.

8. The method of claim 7 wherein the production quantity comprises at least one selected from:
   a number of products provided to at least one of the plurality of sets of at least one tool; and
   a number of products provided by at least one of the plurality of sets of at least one tool.

9. The method of claim 7 wherein the production quantity comprises:
   a number of products provided to at least one of the plurality of sets of at least one tool; and
   a number of products provided by at least one of the plurality of sets of at least one tool.

10. The method of claim 7 wherein the production quantity comprises an amount of time at least one of the plurality of sets of at least one tool takes to process a unit produced by said at least one tool.

11. The method of claim 7 wherein the production quantity comprises an average amount of time at least one tool in at least one of the plurality of sets takes to process a unit produced by said at least one tool in the set.

12. The method of claim 7 wherein the production quantity comprises a number of tools in at least one of the plurality of sets of at least one tool responsive to at least one capacity.

13. The method of claim 7 wherein the production quantity comprises a percent of utilization of the at least one tool in at least one of the plurality of sets.

14. The method of claim 7 wherein the production quantity comprises a number of sets performing a same step in the production system in the plurality of sets.

15. The method of claim 14 wherein each of the number of sets comprises a same number of tools.

16. A computer program product comprising a computer useable medium having computer readable program code embodied therein for predicting at least one production quantity of a production system comprising a first set of at least one tool controlled by a second set of at least one tool, the computer program product comprising computer readable program code devices configured to cause a computer to:
   receive a quantity of time during which the second set of at least one tool is not able to control the first set of at least one tool; and
   calculate the at least one production quantity affected by the first set of at least one tool responsive to the quantity of time received.

17. The computer program product of claim 16 wherein the quantity of time received is a quantity of time at least one of the at least one tool in the second set is not operational.

18. The computer program product of claim 16 wherein at least one of the at least one tool in the first set comprises a production processing tool.

19. The computer program product of claim 16 wherein the quantity of time comprises a percentage.

20. The computer program product of claim 16 wherein the production quantity comprises a throughput.

21. The computer program product of claim 16 wherein the production quantity comprises a good unit equivalents produced per unit of time.

22. The computer program product of claim 16 wherein:
   the production process comprises a plurality of sets of at least one tool, comprising the first set and the second set and a third set; and
   the production quantity is additionally calculated responsive to a quantity related to the third set of at least one tool.

23. The computer program product of claim 22 wherein the production quantity comprises at least one selected from:
   a number of products provided to at least one of the plurality of sets of at least one tool; and
   a number of products provided by at least one of the plurality of sets of at least one tool.

24. The computer program product of claim 22 wherein the production quantity comprises:
   a number of products provided to at least one of the plurality of sets of at least one tool; and
   a number of products provided by at least one of the plurality of sets of at least one tool.

25. The computer program product of claim 22 wherein the production quantity comprises an amount of time at least one of the plurality of sets of at least one tool takes to process a unit produced by said at least one tool.

26. The computer program product of claim 22 wherein the production quantity comprises an average amount of time at least one tool in at least one of the plurality of sets takes to process a unit produced by said at least one tool in the set.

27. The computer program product of claim 22 wherein the production quantity comprises a number of tools in at least one of the plurality of sets of at least one tool responsive to at least one capacity.

28. The computer program product of claim 22 wherein the production quantity comprises a percent of utilization of the at least one tool in at least one of the plurality of sets.

29. The computer program product of claim 22 wherein the production quantity comprises a number of sets performing a same step in the production system in the plurality of sets.

* * * * *